United States Patent [19]

Helfrich, Jr. et al.

[11] 4,329,581
[45] May 11, 1982

[54] AMBIENT LIGHT SENSOR TOUCH SWITCH SYSTEM AND METHOD

[75] Inventors: Robert C. Helfrich, Jr.; Jack E. Francis, Jr., both of Louisville, Ky.

[73] Assignee: General Electric Company, Louisville, Ky.

[21] Appl. No.: 156,439

[22] Filed: Jun. 4, 1980

[51] Int. Cl.³ .............................................. H01J 40/14
[52] U.S. Cl. ................................. 250/221; 250/227; 250/578
[58] Field of Search ........ 250/221, 208, 209, 214 AL, 250/214 B, 227, 229, 578; 340/365 P

[56] References Cited

U.S. PATENT DOCUMENTS

| 3,056,030 | 9/1962 | Kelchner | 250/209 |
| 3,372,789 | 3/1968 | Thiele et al. | 250/221 X |
| 3,373,287 | 3/1968 | Holzer | 250/221 X |
| 3,526,775 | 9/1970 | Friedrich et al. | 250/221 |
| 3,819,906 | 6/1974 | Gould, Jr. | |
| 3,885,408 | 5/1975 | Clark, Jr. | 250/221 |
| 3,937,952 | 2/1976 | Ripley et al. | 250/227 |
| 4,049,964 | 9/1977 | Wuchinich et al. | 340/365 P X |

Primary Examiner—David C. Nelms
Assistant Examiner—Edward P. Westin
Attorney, Agent, or Firm—Frank P. Giacalone; Radford M. Reams

[57] ABSTRACT

An ambient light responsive touch switch system for producing a signal whenever ambient light impinging on a photoelectric detector at a switch location is altered relative to the ambient light sensed by a photoelectric detector at a non-switch location. The system includes means for comparing the intensity of light between the photoelectric detector at a switch location relative to the intensity of ambient light at a non-switch location and a logic system that will produce a signal when the intensity of ambient light at the switch location is altered relative to the ambient light at the non-switch location.

10 Claims, 3 Drawing Figures

AMBIENT LIGHT SENSOR TOUCH SWITCH SYSTEM AND METHOD

BACKGROUND OF THE INVENTION

This invention relates to a control panel for a domestic appliance and more particularly, to a contactless touch switch wherein an electric signal is produced at a location remote from the panel when ambient light from a switch position impinging any one of a plurality of photoelectric detectors is altered relative to the ambient light from a non switch position impinging on a photoelectric detector.

In recent apparatus control systems, the tendency has been to employ touch type switching systems that eliminate mechanical parts and substantially lower the need for servicing. In some prior art touch systems such as the one disclosed in U.S. Pat. No. 3,819,906-Gould, Jr., conductor pads are disposed on either side of a display panel. This type of control approach necessitates that some of the components be arranged in intimate contact with the panel and, further are subjected to the environment found in the area of the panel. For example, current carrying electrical components must be electrically insulated from the panel touch area. In a domestic cooking range, these controls would be exposed to relatively high temperatures generated by the surface elements. Many of the electronic components employed at the panel area may be sensitive to high temperature and unless protected from excessive heat, they can be damaged. In other applications, such as clothes washing machines, the panel may be subjected to high humidity conditions which can create hazardous electrical conditions and also shorten the life of some of the components.

In some type prior art touch switch systems, optical fibers are employed to direct light to a photoelectric detector wherein interruption of light passing through the optical fiber causes a signal to be produced. A disclosure using light pipes is shown in U.S. Pat. No. 3,937,952, wherein an input light pipe and an output light pipe are arranged so that the amount of light from the input light pipe entering the output light is variable between a first level when a switch is actuated to a second level when the switch is not actuated.

In other types prior art touch switch, as shown in U.S. Pat. Nos. 3,526,775-Friedrick et al, and 3,885,408, light is transmitted directly to detector. In both of these disclosures, a contactless switch is actuated by interrupting light from impinging on a photosensitive device by a portion of the hand.

It is an object of the present invention to provide an optical touch switching system and method that is operable in the presence of ambient light.

Another object of the present invention is to provide an optical panel having a plurality of touch areas wherein a signal is produced at a remote location by the presence of a human finger at one or more preselected areas on the panel.

Another object of the present invention is to provide a system and method for producing a signal in which all of the operable and electrical components thereof are located internally of the structures into which entry is desired.

SUMMARY OF THE INVENTION

By the present invention, an ambient light responsive touch switch means is provided for producing a signal whenever ambient light impinging on a selected photoelectric detector is altered. The switch means includes a control panel having a plurality of transparent areas, all but one of which that are adapted to be touched by a portion of the hand, and a plurality of photoelectric detectors corresponding in number to the transparent areas. The ambient light is directed from each of the transparent areas of the panel to an associated photoelectric detector. The switch means further include an ambient light sensing detector that is independent of the touch areas.

The signal producing means arranged remote from the panel are provided for sensing the light associated with the ambient light sensing detector and for comparing the intensity thereof relative to the intensity of ambient light sensed by the other photoelectric detectors. A control is operable when, by touching one of the transparent areas, the intensity of ambient light directed to at least one of the other photoelectric detectors is altered relative to the ambient light sensed by the ambient light sensing detector to produce the signal.

DETAILED DESCRIPTION

The present invention is directed to a touch switch control system having a panel designating input output areas, and accordingly, its use is not intended to be restricted to a particular machine or apparatus. However, it should be noted that the present ambient light sensitive touch switch system was reduced to practice relative to its application on home appliances.

Figure 1:
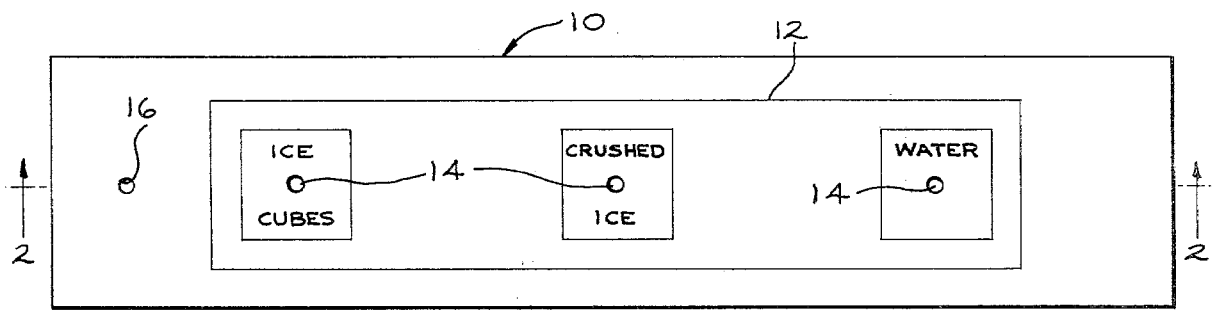
FIG. 1 is a schematic elevational view of a control panel incorporating the present invention.
Figure 2:
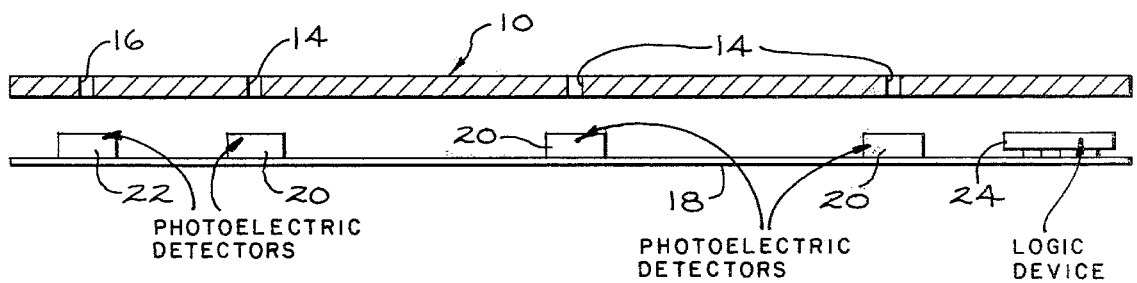
FIG. 2 is a cross sectional view taken along lines 2—2 of FIG. 1.

Referring to FIGS. 1 and 2, an embodiment of a touch switch system in accordance with the invention comprises a control panel 10 formed of any suitable material and preferably have a smooth surface for best appearance and cleanability. Arranged conveniently on the control panel 10 is an input/output display area 12. The control panel 10 and, more particularly, the display area 12 is opaque and includes a plurality of transparent switch touch areas 14 representing, and corresponding to the number of selected functions relating to the home appliance or machine to which the control is applied. The display area may also conveniently include a transparent area 16 which is independent of the input/output function of the switch system and whose function will be explained later. Since the area 16 is a non-switch area, it could be arranged in any convenient areas other than within the display as shown.

In the embodiment shown, the switch system is applied to a household refrigerator of the type having a fresh food section and a freezer section that includes a through-the-door dispensing system having a choice of ice cubes, crushed ice and water dispensing features. In this particular instance, each of the touch area 14 may be designated with the graphic display showing the choice to be made relative to the dispensing capabilities of the system. In another application for example, on a cooking range, there may be provided one touch area for each cooking function of the oven and surface units. When used in conjunction with a clothes washer, the touch areas would display functions appropriate to a clothes washing machine.

Referring now to FIG. 2, there is provided a base plate 18 arranged in spaced relationship with respect to the panel 10. Maintaining an air gap between the panel 10 touch areas and base plate 18 is not critical to the function of the present switch but is effective in electrically isolating the user touchable areas from any electrical components that may be employed in conjunction with the present switch system. Mounted on the base plate 18 and in ambient light communication with each of the transparent areas 14 and area 16 are photoelectric detectors 20 and 22 respectively. While many light detectors are available, the one employed in the present instance is a General Electric NPN-2N5777-80. This arrangement of transparent areas and photoelectric detectors allows the ambient light to impinge on, and accordingly turn the detectors on. In the presence of ambient light all of the photoelectric detectors 20 and 22 are on and no selection has been made. The plate 18 may be a printed circuit board to which the detectors are wired and may further include a logic device 24 capable of producing a signal as will be explained hereinafter.

By the present invention, the presence of ambient light at a non-switch area 16 as sensed by photoelectric detector 22 is compared to the ambient light at the switch touch areas 14 as sensed by any one of the photoelectric detectors 20. When the logic device 24 senses that each of the photoelectric devices 20 are sensing ambient light, it will translate that to mean that none of the areas 14 have been selected or covered by a portion of the hand or finger and, accordingly, no signal is initiated. In operation, when the user selects a function and covers a corresponding transparent touch area 14, ambient light to its cooperating photoelectric detector 20 is cut off and that particular detector turns off. The logic device 24 continues to sense the intensity of ambient sensed by the non-switch associated photoelectric detector 22 and compares it with the selected off detector 20. This comparison between the selected off detector 20 and detector 22 will cause logic device 24 to produce a signal that may operate an interfacing device such as a relay (not shown) associated with the particular function selected at the display area 12.

The present system, by comparing the intensity of the actual ambient light condition as sensed by detector 22 with that light as seen by a selected one of the detector 20, provides effective switching capabilities through a wide range of ambient light conditions. The sensitivity of the system is such that a selection may be made at the display area during all reasonable ambient light conditions that permit user visability of the display area. While many logic devices are available that would carry out the comparing function of the present control, the one employed in reducing the present system to practice is manufactured by INTEL and is indentified as Model 8022.

Figure 3:
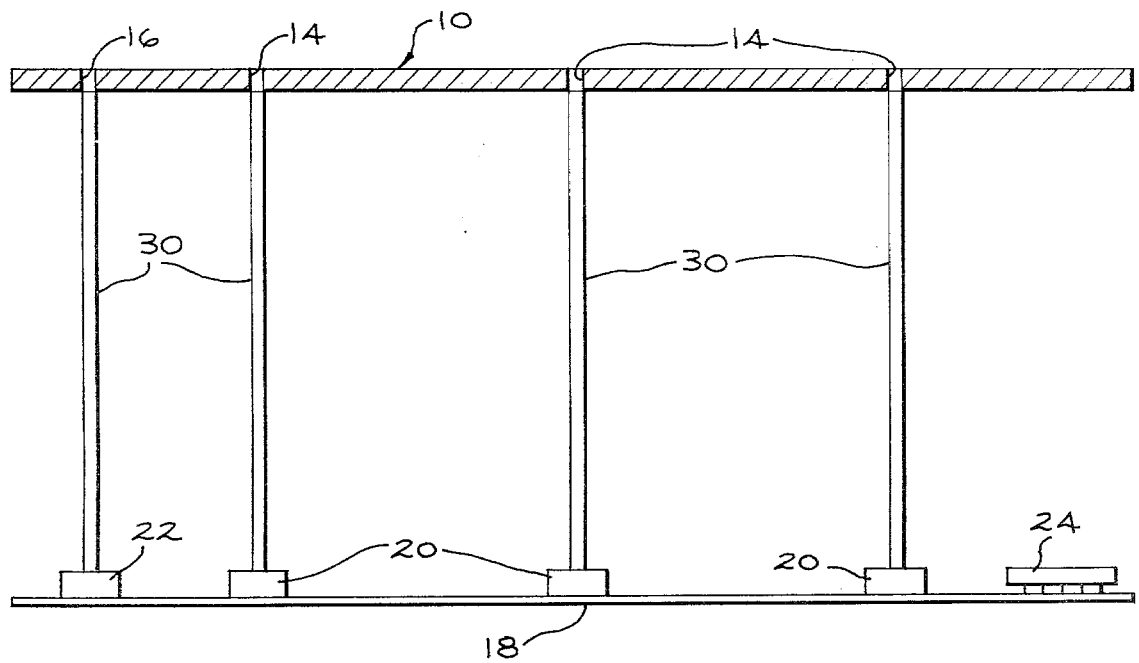
FIG. 3 is a cross sectional view of a control panel disclosing another embodiment of the invention.

In another embodiment of the invention, as shown in FIG. 3, optical fibers or light pipes 30 are employed to direct ambient light between the transparent areas 14 and 16 and their respective photoelectric detectors 20 and 22. The light pipes selected may be quite flexible and thus able to convey light around corners or through tortuous paths. The employment of flexible light pipes allows the photoelectric detectors and other sensitive electronic components to be located at a location remote from the touch panel. This arrangement of light pipes is particularly advantageous when the control panel is in an environmentally hostile area such as when employed in close proximity to the relatively hot range surface or a relatively humid clothes washing machine mentioned hereinbefore.

A further advantage of using light pipes is that it allows design flexibilies in that the relatively flexible light pipes permit the electric components to be located in any convenient location of an appliance.

It should be apparent to those skilled in the art that the embodiment described heretofore is considered to be the presently preferred form of this invention. In accordance with the Patent Statutes, changes may be made in the disclosed apparatus and the manner in which it is used without actually departing from the true spirit and scope of this invention.

What is claimed is:

1. A control panel for selecting a function relating to the operation of a domestic appliance comprising:
   a panel including areas adapted to be touched by a portion of the hand;
   a plurality of photoelectric detectors corresponding in number to said areas;
   means arranging said photoelectric detectors so that each receives ambient light directed from an associated area;
   means for sensing the ambient light associated with one of said photoelectric detectors;
   means for comparing the intensity of said ambient light sensed at said one photoelectric detector relative to the intensity of ambient light at the other of said photoelectric detectors;
   control means operable when the intensity of ambient light directed from an least one of said areas to its associated photoelectric detector is altered relative to ambient light sensed by said one photoelectric detector to operate the selected function.

2. The control panel recited in claim 1 wherein said panel is opaque and said areas are transparent.

3. The control panel recited in claim 2 further comprising means including a plate for positioning said photoelectric detectors in spaced relationship relative to said panel.

4. The control panel recited in claim 2 or 3 wherein said means arranged for directing ambient light include light pipes extending between each of said transparent areas and their associated photoelectric detector.

5. An ambient light responsive touch switch means for producing a signal whenever ambient light impinging on a photoelectric detector is altered comprising;
   a control panel including transparent areas adapted to be touched by a portion of the hand;
   a plurality of photoelectric detectors corresponding in number to said areas;
   means including light pipes arranging said photoelectric detectors so that each receives ambient light directed from an associated area;
   means for sensing the ambient light associated with one of said photoelectric detectors;
   means for comparing the intensity of said ambient light sensed at said one photoelectric detector relative to the intensity of ambient light sensed by the other of said photoelectric detectors;
   control means operable when, by touching a transparent area, the intensity of ambient light directed by at least one of said light pipes to its associated photoelectric detector is altered relative to the ambient light sensed by said one photoelectric detector to produce said signal.

6. The control panel recited in claim 5 wherein said panel is opaque and said areas are transparent.

7. The control panel recited in claim 6 further comprising means including a plate for positioning said photoelectric detectors in relationship relative to said panel.

8. The control panel recited in claim 5 or 7 wherein said means arranged for directing ambient light include light pipes extending between each of said transparent areas and their associated photoelectric detector.

9. A method of producing a signal in an ambient light responsive touch switch means whenever ambient light impinging on a selected photoelectric detector is altered relative to the ambient light comprising;
   providing a control panel including transparent areas adapted to be touched by a portion of the hand;
   providing a plurality of light pipes arranged for directing ambient light between each of said transparent areas and an associated photoelectric detector;
   sensing the ambient light associated with one of said photoelectric detectors;
   comparing the intensity of said ambient light sensed at said one photoelectric detector relative to the intensity of ambient light sensed by the other of said photoelectric detectors;
   touching a transparent area to alter the intensity of ambient light directed by said light pipe to its associated photoelectric detector relative to the ambient light sensed by said one photoelectric detector to produce said signal when a difference in light intensity is sensed.

10. A method of producing a signal in an ambient light responsive touch switch means whenever ambient light impinging on a selected photoelectric detector is altered relative to the ambient light comprising;
   providing a panel including touchable areas designating appliance functions;
   providing a plurality of photoelectric detectors corresponding in number to said areas;
   arranging said photoelectric detectors so that each receives ambient light from an associated area;
   sensing the ambient light associated with one of said photoelectric detectors;
   comparing the intensity of said ambient light sensed at said one photoelectric detector relative to the intensity of ambient light at the other of said photoelectric detectors;
   touching at least one of the areas associated with the other of said photoelectric detectors to alter the intensity of ambient light sensed by the other of said photoelectric detectors relative to the ambient light sensed by said one photoelectric detector to produce said signal.

* * * * *